(12) United States Patent
Sakai

(10) Patent No.: US 10,170,405 B2
(45) Date of Patent: Jan. 1, 2019

(54) WIRING SUBSTRATE AND SEMICONDUCTOR PACKAGE

(71) Applicant: SHINKO ELECTRIC INDUSTRIES CO., LTD., Nagano (JP)

(72) Inventor: Toyoaki Sakai, Nagano (JP)

(73) Assignee: SHINKO ELECTRIC INDUSTRIES CO., LTD., Nagano (JP)

(*) Notice: Subject to any disclaimer, the term of this patent is extended or adjusted under 35 U.S.C. 154(b) by 0 days.

(21) Appl. No.: 15/645,017

(22) Filed: Jul. 10, 2017

(65) Prior Publication Data

US 2018/0019196 A1    Jan. 18, 2018

(30) Foreign Application Priority Data

Jul. 12, 2016  (JP) ................. 2016-137740

(51) Int. Cl.
| | |
|---|---|
| H01L 23/48 | (2006.01) |
| H01L 23/498 | (2006.01) |
| H01L 23/13 | (2006.01) |
| H01L 23/00 | (2006.01) |
| H01L 25/10 | (2006.01) |
| H05K 1/11 | (2006.01) |

(52) U.S. Cl.
CPC ........ *H01L 23/49827* (2013.01); *H01L 23/13* (2013.01); *H01L 23/49816* (2013.01); *H01L 24/81* (2013.01); *H01L 24/97* (2013.01); *H01L 25/105* (2013.01); *H05K 1/112* (2013.01); *H01L 2224/13111* (2013.01)

(58) Field of Classification Search
CPC .... H01L 23/49827; H01L 23/14; H01L 24/81
USPC .................................. 257/701, 775
See application file for complete search history.

(56) References Cited

U.S. PATENT DOCUMENTS

| | | | | |
|---|---|---|---|---|
| 4,811,081 A * | 3/1989 | Lyden | ............. | H01L 21/563 257/668 |
| 4,949,158 A * | 8/1990 | Ueda | ............. | H01L 23/49572 257/668 |
| 5,313,367 A * | 5/1994 | Ishiyama | ............. | H01L 23/49572 361/772 |
| 5,602,419 A * | 2/1997 | Takeda | ............. | H01L 23/3107 257/668 |
| 5,892,271 A * | 4/1999 | Takeda | ............. | H01L 21/563 257/668 |
| 5,915,755 A * | 6/1999 | Gochnour | ............. | H05K 3/4007 257/668 |
| 5,990,546 A * | 11/1999 | Igarashi | ............. | H01L 23/3121 257/700 |

(Continued)

FOREIGN PATENT DOCUMENTS

JP    2011-124555    6/2011

*Primary Examiner* — Nitin Parekh
(74) *Attorney, Agent, or Firm* — IPUSA, PLLC

(57) ABSTRACT

A wiring substrate includes an insulating layer and a wiring layer buried in the insulating layer at a first surface of the insulating layer. The wiring layer includes a first portion and a second portion. The first portion is narrower and thinner than the second portion. The first portion includes a first surface exposed at the first surface of the insulating layer. The second portion includes a first surface exposed at the first surface of the insulating layer and a second surface partly exposed in an opening formed in the insulating layer. The opening is open at a second surface of the insulating layer opposite to the first surface thereof.

13 Claims, 13 Drawing Sheets

(56) References Cited

U.S. PATENT DOCUMENTS

| | | | | |
|---|---|---|---|---|
| 6,100,112 A | * | 8/2000 | Amano | H01L 21/4853 |
| | | | | 257/E21.503 |
| 6,140,707 A | * | 10/2000 | Plepys | H01L 21/50 |
| | | | | 257/668 |
| 6,441,488 B1 | * | 8/2002 | Smith | H01L 21/563 |
| | | | | 257/692 |
| 8,487,192 B2 | | 7/2013 | Kunieda et al. | |

* cited by examiner

US 10,170,405 B2

WIRING SUBSTRATE AND SEMICONDUCTOR PACKAGE

CROSS-REFERENCE TO RELATED APPLICATION

This application is based upon and claims the benefit of priority of the prior Japanese Patent Application No. 2016-137740, filed on Jul. 12, 2016, the entire contents of which are incorporated herein by reference.

FIELD

A certain aspect of the embodiment discussed herein is related to wiring substrates and semiconductor packages.

BACKGROUND

A wiring substrate including a single insulating layer and a single wiring layer to reduce thickness is known. One surface of the wiring layer is exposed at one surface of the insulating layer, and the other surface of the wiring layer is exposed in an opening provided in the other surface of the insulating layer.

According to such a wiring substrate, the wiring layer is formed by, for example, forming a resist layer having an opening, depositing a metal having a certain plating thickness in the opening of the resist layer by, for example, electroplating, and thereafter removing the resist layer. (See, for example, Japanese Laid-open Patent Publication No. 2011-124555.)

SUMMARY

According to an aspect of the invention, a wiring substrate includes an insulating layer and a wiring layer buried in the insulating layer at a first surface of the insulating layer. The wiring layer includes a first portion and a second portion. The first portion is narrower and thinner than the second portion. The first portion includes a first surface exposed at the first surface of the insulating layer. The second portion includes a first surface exposed at the first surface of the insulating layer and a second surface partly exposed in an opening formed in the insulating layer. The opening is open at a second surface of the insulating layer opposite to the first surface thereof.

The object and advantages of the invention will be realized and attained by means of the elements and combinations particularly pointed out in the claims.

It is to be understood that both the foregoing general description and the following detailed description are exemplary and explanatory and not restrictive of the invention, as claimed.

DESCRIPTION OF EMBODIMENTS

Figure 1A:
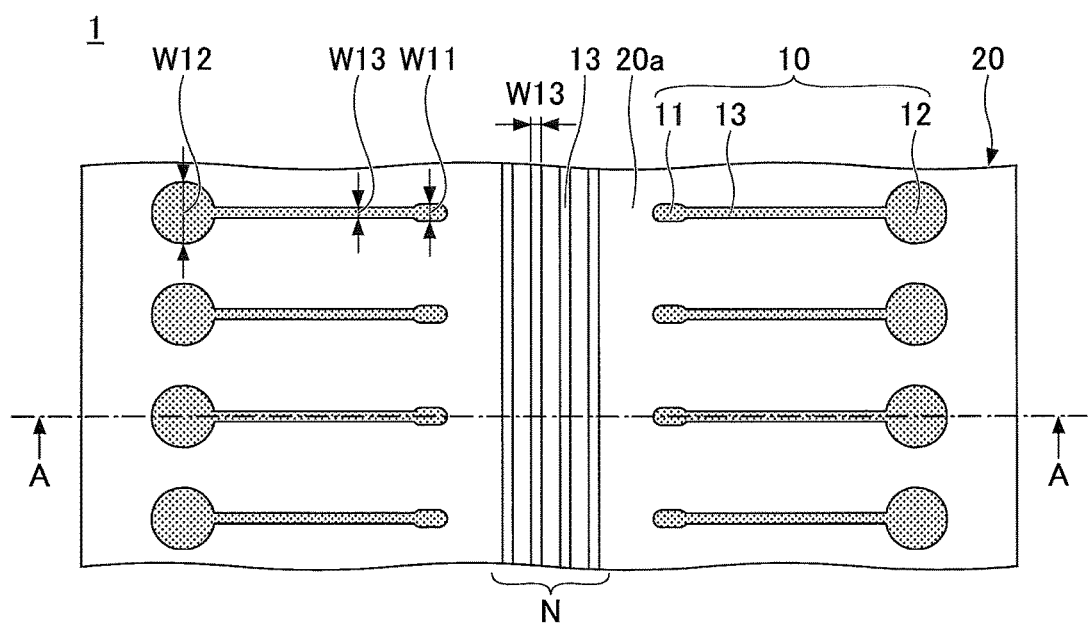
FIGS. 1A and 1B are diagrams depicting a wiring substrate according to an embodiment.

When the wiring layer is formed to have a desired plating thickness, however, the aspect ratio of the resist layer is higher in a fine pattern portion than in a rough pattern portion. The resist layer, which is removed after a plating process, is easily removed in the rough pattern portion, while a removal failure is likely to occur in the fine pattern portion where the aspect ratio is high. Furthermore, a removal failure in the fine pattern portion is more likely to occur as the plating thickness becomes larger. Here, the fine pattern portion refers to a portion in which the line/space is 20 μm/20 μm or less, and the rough pattern portion refers to a portion in which the line/space is more than 20 μm/20 μm.

According to an aspect of the present invention, a wiring substrate having a structure that is less likely to cause a removal failure of a resist layer and a semiconductor package including the wiring substrate are provided.

A preferred embodiment of the present invention will be explained with reference to accompanying drawings. In the drawings, the same elements or configurations are referred to using the same reference numeral, and a repetitive description thereof may be omitted.

First, a structure of a wiring substrate according to an embodiment is described. FIG. 1A is a plan view of part of the wiring substrate according to this embodiment, and FIG. 1B is a cross-sectional view of the wiring substrate taken along the line A-A in FIG. 1A.

Figure 1B:
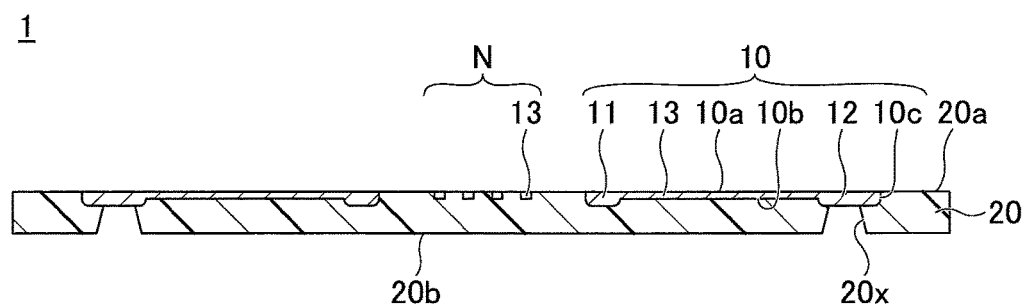

Referring to FIGS. 1A and 1B, a wiring substrate 1 is a coreless wiring substrate including a single wiring layer 10 and a single insulating layer 20. In FIG. 1A, the wiring layer 10 is indicated by a dot pattern for clarification.

According to this embodiment, in the wiring substrate 1, for convenience of description, the side on which the wiring layer 10 is exposed in the insulating layer 20 will be referred to as "upper side" or "first side," and the side on which openings 20x are open in the insulating layer 20 will be referred to as "lower side" or "second side." Furthermore, with respect to each part or element of the wiring substrate 1, a surface on the upper or first side will be referred to as "upper surface" or "first surface," and a surface on the lower or second side will be referred to as "lower surface" or "second surface." The wiring substrate 1, however, may be used in an inverted position or oriented at any angle. Furthermore, a plan view refers to a view of an object taken in a direction normal to an upper surface 20a of the insulating layer 20, and a planar shape refers to the shape of an object viewed in a direction normal to the upper surface 20a of the insulating layer 20.

The wiring layer 10 is buried in the insulating layer 20 at the upper surface 20a. An upper surface 10a of the wiring layer 10 is exposed at the upper surface 20a of the insulating layer 20. A lower surface 10b and a side surface 10c of the wiring layer 10 are covered with the insulating layer 20. The upper surface 10a of the wiring layer 10 may be, for example, flush with the upper surface 20a of the insulating layer 20. The wiring layer 10 is formed of a single metal layer. Suitable materials for the wiring layer 10 include, for example, copper (Cu).

The wiring layer 10 includes pads 11, pads 12, and wiring patterns 13. The pads 11 may be connected to the pads 12 via the corresponding wiring patterns 13. The upper-side surface of the wiring substrate 1 serves as a chip mounting surface on which a semiconductor chip is to be mounted, and the pads 11 exposed at the upper surface 20a of the insulating layer 20 serve as pads for connecting a semiconductor chip.

According to this embodiment, the wiring layer 10 includes a narrow portion having a small width (a first portion) and a wide portion having a large width (a second portion). The wiring layer 10 is thinner (has a smaller thickness) in the narrow portion than in the wide portion. Whether a portion is narrow or wide may be suitably determined in accordance with the specifications of the wiring substrate 1. Here, by way of example, a portion is narrow if the width of the portion is 15 µm or less, and is wide if the width of the portion is more than 15 µm. Here, the width of a portion refers to the diameter of the portion when the planar shape of the portion is a circle, the minor axis of the portion when the planar shape of the portion is an ellipse, and the shorter side of the portion when the planar shape of the portion is elongated.

The pads 11 and 12 are a wide portion, and the wiring patterns 13 are a narrow portion. A width W11 of the pads 11 may be, for example, approximately 25 µm. The interval of the pads 11 may be, for example, approximately the same as the width W11 of the pads 11. A width W12 of the pads 12 may be, for example, approximately 80 µm. The interval of the pads 12 may be, for example, approximately the same as the width W12 of the pads 12. The pads 11 and 12 may be, for example, approximately 15 µm in thickness.

A width W13 of the wiring patterns 13 may be, for example, approximately 10 µm. The interval of the wiring patterns 13 may be, for example, approximately the same as the width W13 of the wiring patterns 13. The wiring patterns 13 may be, for example, approximately 12 µm in thickness.

The wiring patterns 13 at a center N of the wiring layer 10 in FIGS. 1A and 1B are arranged at a narrow pitch to be formed as a portion of a particularly narrow line/space. Here, the line of a line/space represents the width of a wiring pattern (wiring width), and the space of a line/space represents the interval between adjacent wiring patterns (wiring interval). For example, a line/space of 8 µm/8 µm indicates that the wiring width is 8 µm and the interval between adjacent wiring patterns is 8 µm. According to this embodiment, a portion of a particularly narrow line/space is a portion of a line/space of 8 µm/8 µm or less. Wiring patterns of a line/space of approximately 1 µm/1 µm to approximately 3 µm/3 µm may be formed as a portion of a particularly narrow line/space.

The upper surfaces of the pads 11, the upper surfaces of the pads 12, and the upper surfaces of the wiring patterns 13 are in the same plane. That is, while the thickness of the pads 11 and 12 is different from the thickness of the wiring patterns 13, the upper surfaces of the pads 11 and 12 and the wiring patterns 13 exposed in the insulating layer 20 are flush with one another, and the lower surfaces of the pads 11 and 12 and the wiring patterns 13 extending from the pads 11, opposite to their exposed surfaces, form steps in the insulating layer 20.

The insulating layer 20 is a layer in which the wiring layer 10 is formed. Suitable materials for the insulating layer 20 include, for example, a thermosetting non-photosensitive resin whose principal component is, for example, an epoxy resin, an imide resin, a phenolic resin, or a cyanate resin, and a thermosetting photosensitive resin whose principal component is, for example, an epoxy resin, a phenolic resin, or synthetic rubber.

Furthermore, the insulating layer 20 may contain a reinforcing member formed of a woven or non-woven fabric of, for example, glass fibers or aramid fibers. The insulating layer 20 may contain a filler such as silica or alumina. The thickness of the insulating layer 20 may be, for example, approximately 10 µm to approximately 50 µm. The thickness of the insulating layer 20 is the distance from the lower surfaces of the pads 12 to a lower surface 20b of the insulating layer 20.

The openings 20x that are open at the second surface 20b of the insulating layer are formed in the insulating layer 20. The lower surfaces of the pads 12 of the wiring layer 10 are partly exposed in the openings 20x. The lower-side surface of the wiring substrate 1 serves as an external connection terminal surface on which external connection terminals are to be formed. The pads 12 exposed in the openings 20x are pads for external connection. External connection terminals such as solder balls may be provided on the lower surfaces of the pads 12 exposed in the openings 20x on an as-needed basis. The openings 20x are formed in the shape of, for example, a truncated cone that is greater in diameter at the lower surface 20b of the insulating layer 20 than at the lower surfaces of the pads 12.

A metal layer may be formed on the upper surface 10a of the wiring layer 10 and on the lower surfaces of the pads 12 of the wiring layer 10 exposed in the openings 20x. Suitable examples of metal layers include a gold (Au) layer, a Ni/Au layer (a laminated metal layer of a nickel [Ni] layer and a Au layer that are stacked in this order), and a Ni/Pd/Au layer (a laminated metal layer of a Ni layer, a palladium [Pd] layer, and a Au layer that are stacked in this order). Instead of forming a metal layer, an anti-oxidation treatment such as an organic solderability preservative (OSP) process may be performed. A surface treatment layer formed by the OSP process is an organic coating formed of, for example, an azole compound or an imidazole compound.

Next, a method of manufacturing a wiring substrate according to this embodiment is described. FIGS. 2A through 2M are diagrams depicting a process of manufacturing a wiring substrate according to this embodiment. According to this embodiment, by way of example, a structure to become multiple wiring substrates is formed on a support, and after removal of the support, the structure is divided into individual wiring substrates. Alternatively, however, individual wiring substrates may be formed on a support, and the support may thereafter be removed.

Figure 2A:
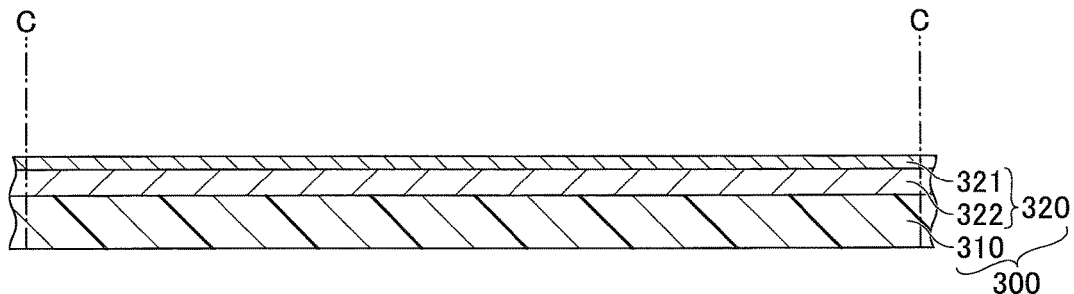
FIGS. 2A through 2M are diagrams depicting a process of manufacturing a wiring substrate according to the embodiment.

First, in the process depicted in FIG. 2A, a support 300 having a flat top surface is prepared. A prepreg 310 on which metal foil with a carrier ("carrier-supported metal foil") 320 is stacked may be used as the support 300. The thickness of the support 300 may be, for example, approximately 18 µm to approximately 100 µm.

The prepreg 310 is a woven or non-woven fabric of, for example, glass fibers or aramid fibers (not depicted) impregnated with an insulating resin such as an epoxy resin. The carrier-supported metal foil 320 includes thick foil (carrier foil) 322 formed of copper and having a thickness of approximately 10 μm to approximately 50 μm, and thin foil 321 formed of copper and having a thickness of approximately 1.5 μm to approximately 5 μm. The thin foil 321 separably adheres to the thick foil 322 through a delamination layer (not depicted). The thick foil 322 is provided as a support for facilitating handling of the thin foil 321. The bottom surface of the thick foil 322 is bonded to the top surface of the prepreg 310.

Figure 2B:
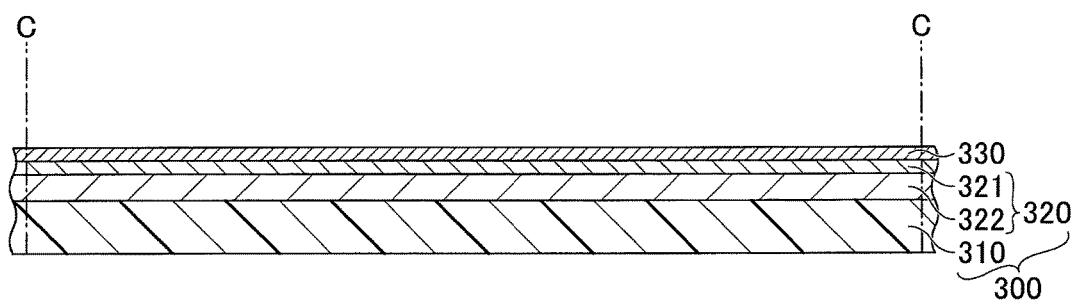

Next, in the process depicted in FIG. 2B, for example, electroplating is performed, using the carrier-supported metal foil 320 as a plating power feed layer, to form a barrier layer 330 on the top surface of the thin foil 321 of the support 300. The barrier layer 330 serves as an etch stop layer when the thin foil 321 is removed by etching in a subsequent process. Suitable materials for the barrier layer 330 include, for example, a metal not removed with an etchant for the thin foil 321 formed of copper, such as nickel. The thickness of the barrier layer 330 may be, for example, approximately a few microns (μm).

Figure 2C:
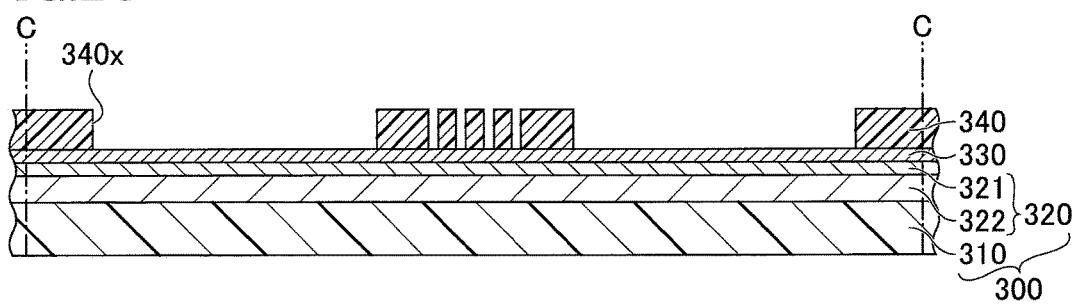

Next, in the process depicted in FIG. 2C, a resist layer 340 is formed on the top surface of the barrier layer 330. The resist layer 340 includes openings 340x in which the wiring layer 10 is to be formed. Specifically, for example, the top surface of the barrier layer 330 is laminated with a dry film resist formed of a photosensitive resin as the resist layer 340. The dry film resist is exposed to light and developed to be patterned to form the openings 340x that expose the top surface of the barrier layer 330 where the wiring layer 10 is to be formed.

Figure 2D:
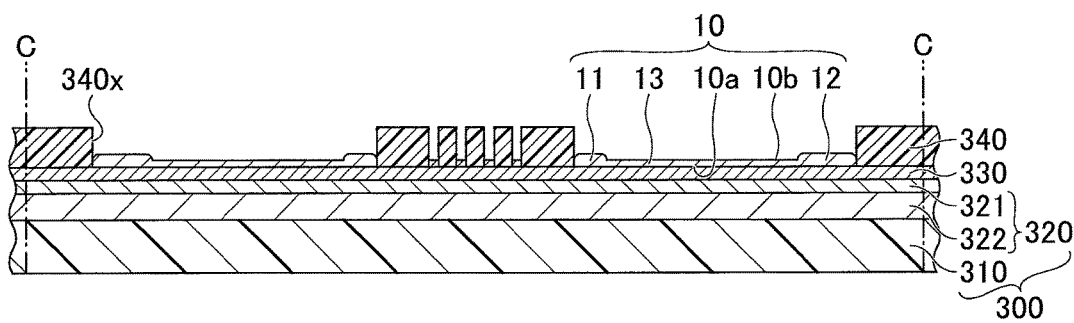

Next, in the process depicted in FIG. 2D, electroplating is performed, using the carrier-supported metal foil 320 and the barrier layer 330 as plating power feed layers, to form the wiring layer 10 on the top surface of the barrier layer 330 exposed in the openings 340x of the resist layer 340. The first surface 10a of the wiring layer 10 contacts the top surface of the barrier layer 330, and the second surface 10b of the wiring layer 10 is exposed in the openings 340x.

Figure 11:
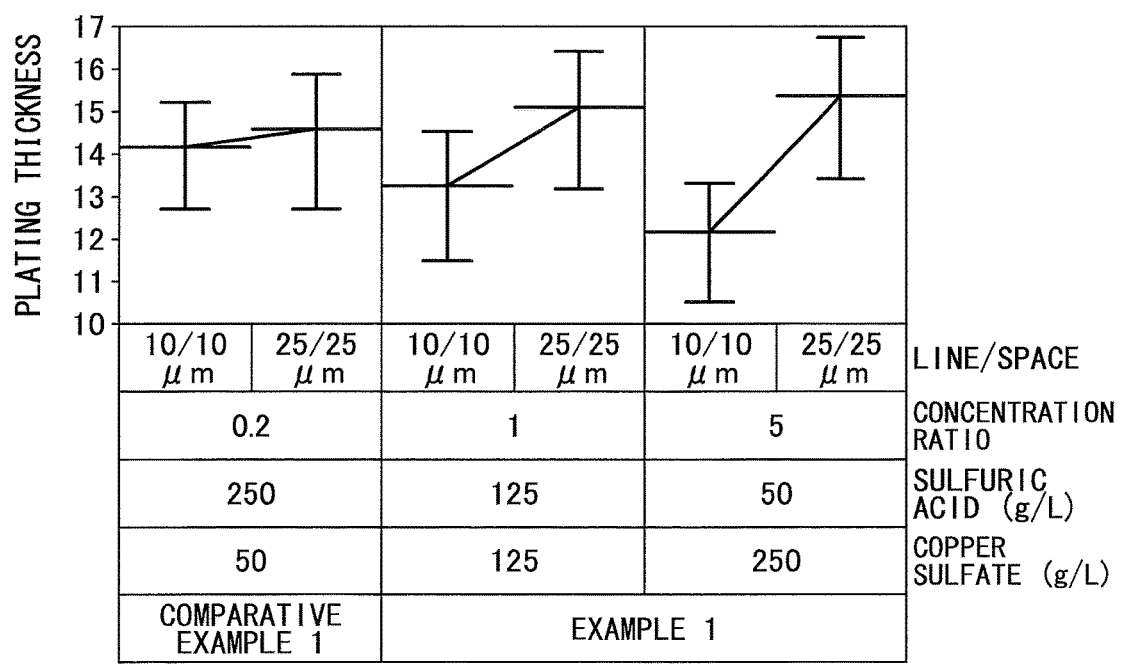
FIG. 11 is a diagram illustrating the results of Example 1.

For example, a bath of an electrolytic copper plating solution prepared from copper sulfate and sulfuric acid of a predetermined concentration ratio is used to deposit copper plating on the barrier layer 330, so that the pads 11 and 12, which are a wide portion, can be formed to be thick, and the wiring patterns 13, which are a narrow portion, can be formed to be thin. At this point, the concentration ratio of copper sulfate and sulfuric acid (copper sulfate/sulfuric acid) is preferably 1 or more, and is preferably approximately 5 to particularly reduce the thickness of the narrow portion, namely, the wiring patterns 13 (FIG. 11). Examples of the numerical values of the width and thickness of the pads 11, the pads 12, and the wiring patterns 13 are as described above with reference to FIGS. 1A and 1B.

Figure 2E:
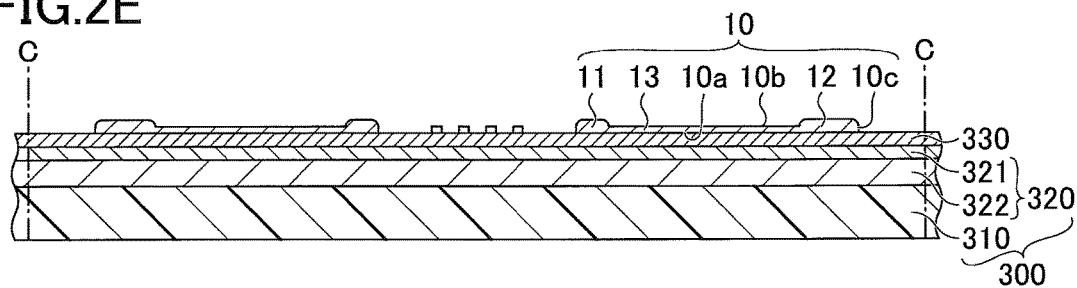

Next, in the process depicted in FIG. 2E, the resist layer 340 depicted in FIG. 2D is removed. For example, a liquid separating agent (remover) containing sodium hydroxide may be used to remove the resist layer 340. At this point, if the narrow wiring patterns 13 were thick, there would be resist patterns of a narrow pitch and a high aspect ratio sandwiched between the wiring patterns 13 of a narrow pitch and a high aspect ratio, thus causing poor removal of resist patterns to be more likely to occur as described above.

In contrast, according to this embodiment, plating conditions are adjusted to reduce the thickness of the wiring patterns 13 in the process depicted in FIG. 2D. Therefore, in each of the resist patterns of a narrow pitch and a high aspect ratio sandwiched between the wiring patterns 13 of a narrow pitch, it is possible to reduce the area of contact of the side surfaces of the resist pattern with the adjacent wiring patterns 13.

As a result, the area of contact of the side surfaces of the resist patterns with the wiring patterns 13 is reduced. Therefore, it is possible to easily remove the resist patterns. Accordingly, it is possible to reduce the occurrence of poor removal of the resist layer 340. This effect is conspicuous in a portion of the wiring layer 10 formed as the wiring patterns 13 of a particularly narrow line/space, where the line/space is 8 μm/8 μm or less (for example, the center N in FIGS. 1A and 1B).

In the process depicted in FIG. 2E, the second surface 10b and the side surface 10c of the wiring layer 10 may be roughened. Roughening may be performed by, for example, impregnation with or the spraying of an aqueous solution such as an aqueous solution of formic acid, an aqueous solution of hydrogen peroxide and sulfuric acid, an aqueous solution of sodium persulfate, or an aqueous solution of ammonium persulfate. By roughening, the second surface 10b and the side surface 10c of the wiring layer 10 are roughened to have a surface roughness Ra of approximately 100 nm to approximately 500 nm, for example, 300 nm. Roughening improves the adhesion between the wiring layer 10 and the insulating layer 20 to be formed in a subsequent process, and renders the surface roughness of the second surface 10b and the side surface 10c of the wiring layer 10 greater than the surface roughness of the first surface 10a of the wiring layer 10.

Figure 2F:
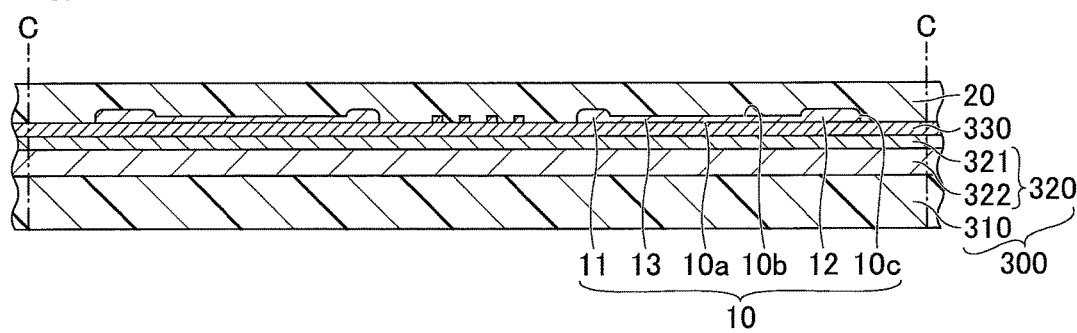

Next, in the process depicted in FIG. 2F, the insulating layer 20 is formed on the top surface of the barrier layer 330 to cover the second surface 10b and the side surface 10c of the wiring layer 10. Specifically, the top surface of the barrier layer 330 is laminated with, for example, a thermosetting epoxy insulating resin in film form to cover the wiring layer 10. Alternatively, for example, a thermosetting epoxy insulating resin in liquid or paste form is applied on the top surface of the barrier layer 330 by a process such as screen printing or spin coating to cover the wiring layer 10. The laminate of insulating resin or the applied insulating resin is heated to a curing temperature or higher to be cured to form the insulating layer 20. A pressure may be applied to the laminate of insulating resin or the applied insulating resin during heating on an as-needed basis.

Figure 2G:
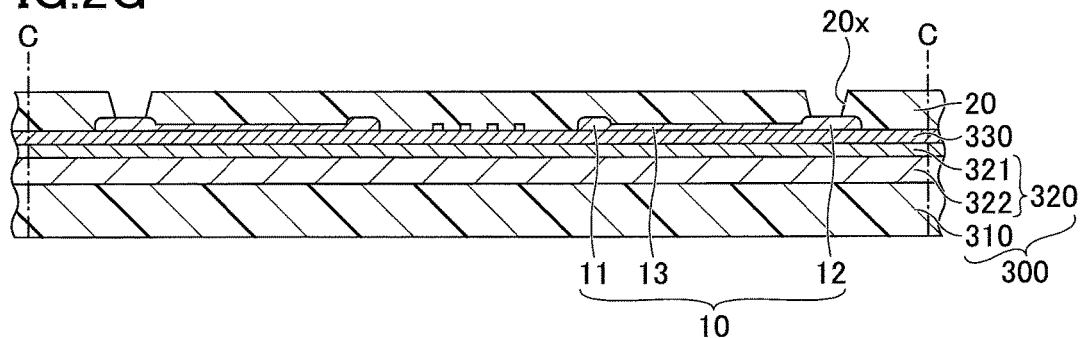

Next, in the process depicted in FIG. 2G, the openings 20x are formed in the insulating layer 20 to pierce through the insulating layer 20 to expose the second surfaces of the pads 12. The openings 20x may be formed by, for example, laser processing using a $CO_2$ laser. When the insulating layer 20 is formed of a photosensitive resin, the photosensitive resin may be exposed to light and developed to form the openings 20x in the insulating layer 20 (photolithography).

When the openings 20x are formed by laser processing, it is preferable to perform a desmear process to remove the residual resin of the insulating layer 20 adhering to the second surfaces of the pads 12 exposed in the openings 20x. The pads 12, which are exposed to laser light, are thickly formed to reduce the possibility of the penetration of the laser light through the pads 12.

To remove the residual resin, soft etching may be performed in addition to the desmear process to etch and form recesses in the second surfaces of the pads 12 exposed in the openings 20x of the structure depicted in FIG. 2G. Because the pads 12 are thickly formed, the pads 12 are free from the risk of being pierced through by the recesses formed by this process.

Figure 2H:
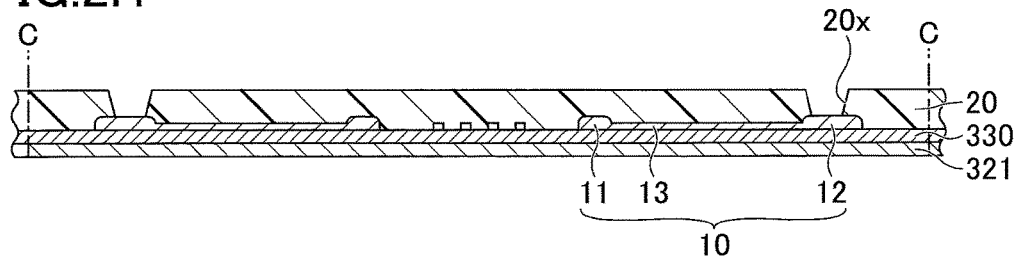

Next, in the process depicted in FIG. 2H, part of the support 300 is removed from the structure depicted in FIG. 2G. Specifically, a mechanical force is applied to the support 300 to delaminate the carrier-supported metal foil 320 at the interface of the thin foil 321 and the thick foil 322. As described above, the carrier-supported metal foil 320 has the thick foil 322 adhering to the thin foil 321 through a delamination layer (not depicted). Therefore, the thick foil 322, together with the delamination layer, is easily separated from the thin foil 321.

As a result, the thin foil 321 alone remains on the barrier layer 330, and the other members of the support 300 (the prepreg 310 and the thick foil 322) are removed. In addition to the case where the thick foil 322, together with the delamination layer, is separated from the thin foil 321, it is also possible that a cohesive failure occurs inside the delamination layer to separate the thick foil 322 from the thin foil 321. Furthermore, it is also possible that the thick foil 322 is separated from the delamination layer to be separated from the thin foil 321.

Figure 2I:
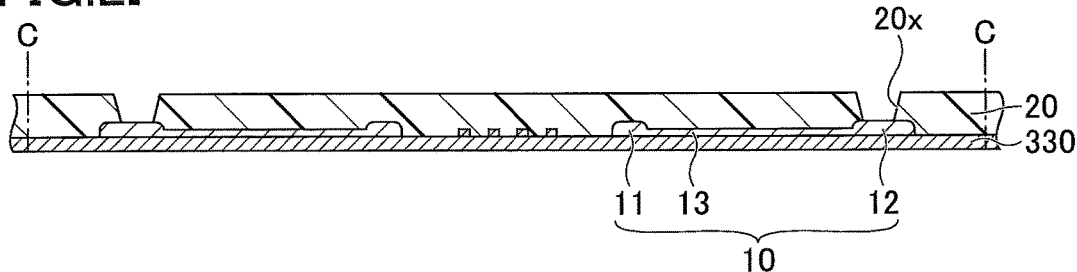

Next, in the process depicted in FIG. 2I, etching is performed to remove the thin foil 321 formed of copper (FIG. 2H). The thin foil 321 formed of copper may be removed by wet etching, using, for example, an aqueous solution of hydrogen peroxide and sulfuric acid, an aqueous solution of sodium persulfate, or an aqueous solution of ammonium persulfate. When the barrier layer 330 is formed of nickel, the barrier layer 330 is not removed with the above-described etchant for copper to serve as an etch stop layer to prevent the wiring layer 10 from being etched.

Figure 2J:
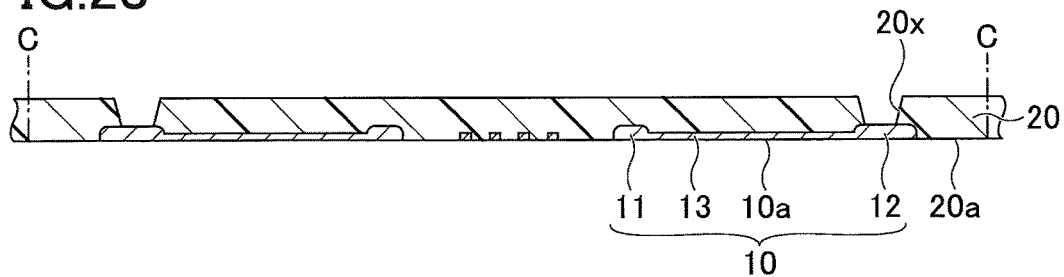

Next, in the process depicted in FIG. 2J, the barrier layer 330 (FIG. 2I) is removed. When the barrier layer 330 is formed of nickel, an etchant that does not remove copper but removes nickel may be selected to etch the barrier layer 330 alone without etching the wiring layer 10. As a result, the first surface 10a of the wiring layer 10 is exposed at the first surface 20a of the insulating layer 20. The first surface 10a of the wiring layer 10 may be, for example, flush with the first surface 20a of the insulating layer 20.

A metal layer may be formed on the first surface 10a of the wiring layer 10 and on the second surfaces of the pads 12 of the wiring layer 10 exposed in the openings 20x by, for example, electroless plating, on an as-needed basis. Suitable examples of metal layers are as described above. Furthermore, an anti-oxidation treatment such as an OSP process may be performed instead of forming a metal layer.

After the process depicted in FIG. 2J, the structure depicted in FIG. 2J is cut at cutting positions C into individual pieces, using, for example, a slicer, to complete multiple wiring substrates 1 (FIGS. 1A and 1B). External connection terminals such as solder balls may be provided on the pads 11 and/or the pads 12 exposed in the openings 20x on an as-needed basis.

Figure 2K:
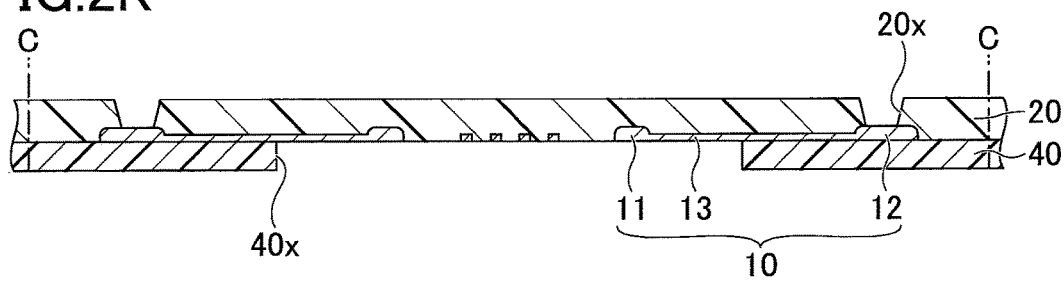

Furthermore, as depicted in FIG. 2K, a solder resist layer 40 having an opening 40x may be formed on the chip mounting surface of the wiring substrate 1 on an as-needed basis. The solder resist layer 40 may be formed either before or after cutting the structure depicted in FIG. 2J at the cutting positions C with, for example, a slicer.

The solder resist layer 40 may be formed by, for example, applying an insulating resin in liquid or paste form on the insulating layer 20 by a process such as screen printing, roll coating, or spin coating to cover the wiring layer 10 with the insulating resin. The solder resist layer 40 may alternatively be formed by laminating the insulating layer 20 with an insulating resin in film form to cover the wiring layer 10. For example, a photosensitive epoxy insulating resin or a photosensitive acrylic insulating resin may be used as an insulating resin.

The applied insulating resin or the laminate of insulating resin may be exposed to light and developed to form the opening 40x that exposes the pads 11 and part of the wiring patterns 13 of the wiring layer 10 in the solder resist layer 40 (photolithography). In the case of using a non-photosensitive insulating resin (thermosetting resin) whose principal component is an epoxy resin or a polyimide resin as the material of the solder resist layer 40, the opening 40x may be formed by, for example, laser processing or blasting.

Figure 2L:
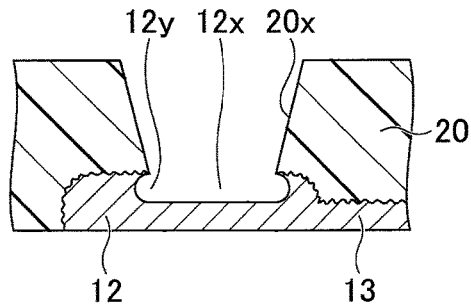

In the case where the second surface 10b and the side surface 10c of the wiring layer 10 are roughened in the process depicted in FIG. 2E and the second surfaces of the pads 12 exposed in the openings 20x are subjected to soft etching in the process depicted in FIG. 2G, the pads 12 and their vicinity are as depicted in FIG. 2L. That is, the second surface 10b and the side surface 10c of the wiring layer 10 including the pads 12 are roughened, and a recess 12x is formed in each of the second surfaces of the pads 12 exposed in the openings 20x. Furthermore, the periphery (sidewall) of the recess 12x is laterally concaved toward the insulating layer 20 relative to the inner wall of the corresponding opening 20x to form an undercut 12y.

Figure 2M:
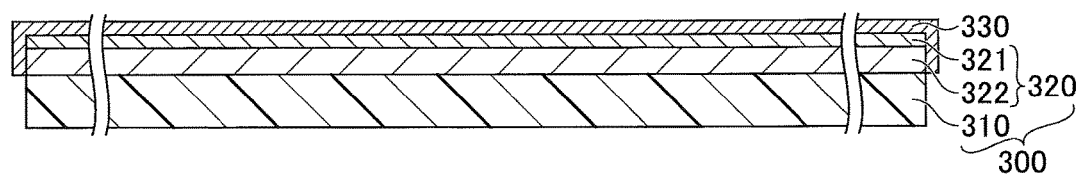

Furthermore, in the process depicted in FIG. 2B, the barrier layer 330 may alternatively be formed to continuously cover the top surface of the thin foil 321 of the support 300 and the side surface of the carrier-supported metal foil 320 (the side surface of the thin foil 321 and the side surface of the thick foil 322) of the support 300 as depicted in FIG. 2M. This structure is preferable in being able to prevent accidental delamination of the carrier-supported metal foil 320 during the manufacturing process of the wiring substrate 1. The process subsequent to the process of FIG. 2M is equal to the process of FIGS. 2C through 2J.

Thus, according to this embodiment, the wiring layer 10 is formed by, for example, depositing copper plating on the barrier layer 330, using a bath of an electrolytic copper plating solution prepared from copper sulfate and sulfuric acid of a predetermined concentration ratio. As a result, of the wiring layer 10, the wiring patterns 13, which are a narrow portion, can be formed to be thin, and the pads 11 and 12, which are a wide portion, can be formed to be thick.

Therefore, in each of the resist patterns of a narrow pitch and a high aspect ratio sandwiched between the wiring patterns 13 of a narrow pitch, it is possible to reduce the area of contact of the side surfaces of the resist pattern with the adjacent wiring patterns 13. As a result, because the area of contact of the side surfaces of the resist patterns with the wiring patterns 13 is reduced, it is possible to easily remove the resist patterns. Accordingly, it is possible to reduce the occurrence of poor removal of the resist layer 340.

In particular, the concentration ratio of copper sulfate and sulfuric acid (copper sulfate/sulfuric acid) is preferably approximately 5 to particularly reduce the thickness of the narrow portion, namely, the wiring patterns 13. In this case, it is possible to further reduce poor removal of the resist layer 340.

Solder may be famed on the pads 11 and 12. In this case, an alloy layer is formed at the interface between the pads 11 and 12 and the solder to substantively reduce the thickness of the pads 11 and 12. Reduction in the thickness of a pad causes a problem in that the pad becomes brittle. According to the wiring substrate 1, however, the pads 11 and 12 are thicker than the wiring patterns 13. Therefore, even when the alloy layer is formed, a large part of each of the pads 11 and 12 remains free of formation of the alloy layer. Therefore, it is possible to reduce the effect of the alloy layer.

Furthermore, because the pads 11 and 12 are thicker than the wiring patterns 13, it is possible to prevent excessive reduction in the thickness of the pads 11 and 12 even when, for example, acid cleaning or the like is performed on the pads 11 and 12 as pretreatment before electroless plating.

Next, a first variation of the embodiment is described. According to the first variation, the positional relationship between the first surface 10a of the wiring layer 10 and the first surface 20a of the insulating layer 20 is different from that of the above-described embodiment. In the description of the first variation, a description of the same elements or configurations as those of the above-described embodiment may be omitted.

Figure 3:
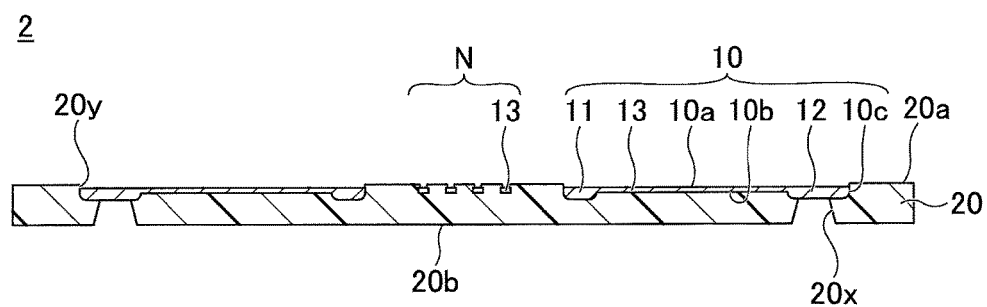
FIG. 3 is a cross-sectional view of a wiring substrate according to a first variation of the embodiment.

FIG. 3 is a cross-sectional view of a wiring substrate according to the first variation, depicting a cross section corresponding to the cross section depicted in FIG. 1B.

Referring to FIG. 3, a wiring substrate 2 is different from the wiring substrate 1 (FIGS. 1A and 1B) in that recesses 20y are formed in the insulating layer 20 to have the first (upper) surface 10a of the wiring layer 10 exposed in the recesses 20y, being depressed relative to (at a position lower than) the first (upper) surface 20a of the insulating layer 20. The wiring substrate 2 may be manufactured by the following process, for example.

Figure 4A:
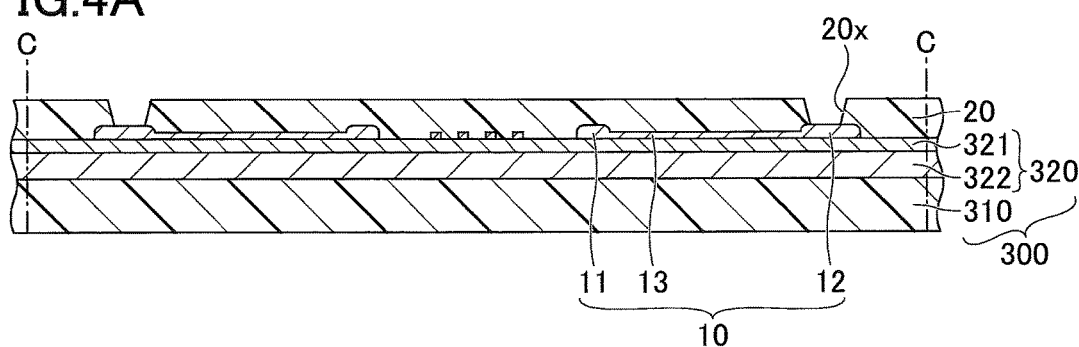
FIGS. 4A through 4C are diagrams depicting a process of manufacturing a wiring substrate according to the first variation.
Figure 4B:
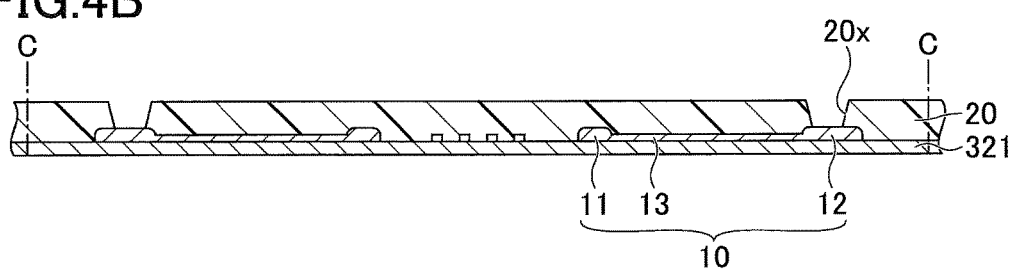
Figure 4C:
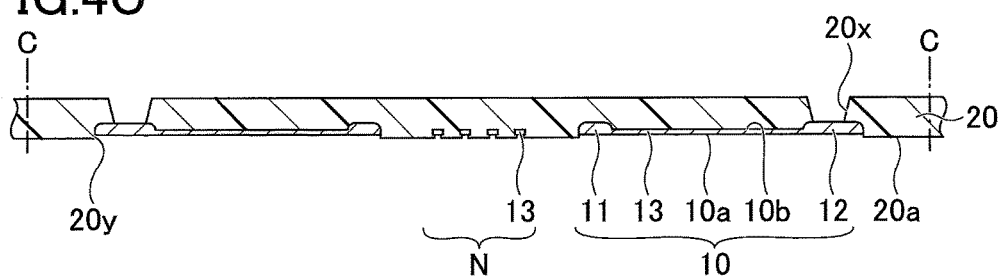

FIGS. 4A through 4C are diagrams depicting a process of manufacturing a wiring substrate according to the first variation. According to the first variation, the barrier layer 330 is not formed on the support 300.

First, in the process depicted in FIG. 4A, after the process depicted in FIG. 2A, the same process as in FIGS. 2C through 2G is executed to stack the wiring layer 10 and the insulating layer 20 directly on the support 300. Next, in the process depicted in FIG. 4B, the prepreg 310 and the thick foil 322 of the support 300 are separated from the structure depicted in FIG. 4A in the same manner as in the process depicted in FIG. 2H. As a result, the thin foil 321 alone remains on the insulating layer 20, and the other members of the support 300 (the prepreg 310 and the thick foil 322) are removed.

Next, in the process depicted in FIG. 4C, etching is performed to remove the thin foil 321 formed of copper (FIG. 4B) in the same manner as in the process depicted in FIG. 2I. According to the first variation, because the barrier layer 330 that serves as an etch stop layer is absent, the wiring layer 10 formed of copper also is etched on the first surface 10a side to form the recesses 20y in the first surface 20a of the insulating layer 20. Accordingly, the first surface 10a of the wiring layer 10 is exposed in the recesses 20y, being depressed relative to the first surface 20a of the insulating layer 20.

After the process depicted in FIG. 4C, the structure depicted in FIG. 4C is cut at cutting positions C into individual pieces, using, for example, a slicer, to complete multiple wiring substrates 2.

For example, a metal layer may be formed on the first surface 10a of the wiring layer 10 and on the second surfaces of the pads 12 of the wiring layer 10 exposed in the openings 20x on an as-needed basis. Furthermore, external connection terminals such as solder balls may be provided on the pads 11 and/or the pads 12 exposed in the openings 20x on an as-needed basis. In addition, the solder resist layer 40 having the opening 40x may be formed on the chip mounting surface of the wiring substrate 2 on an as-needed basis.

Next, a second variation of the embodiment is described. The second variation is directed to another method of manufacturing the wiring substrate 1. In the description of the second variation, a description of the same elements or configurations as those of the above-described embodiment may be omitted.

Figure 5A:
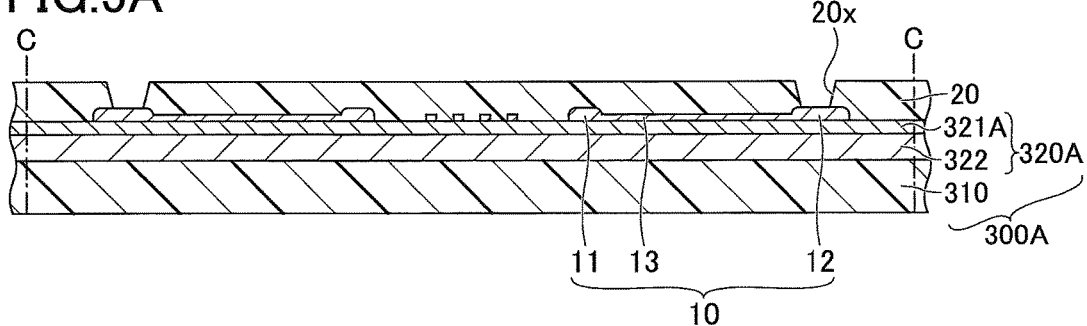
FIGS. 5A through 5C are diagrams depicting a process of manufacturing a wiring substrate according to a second variation of the embodiment.
Figure 5B:
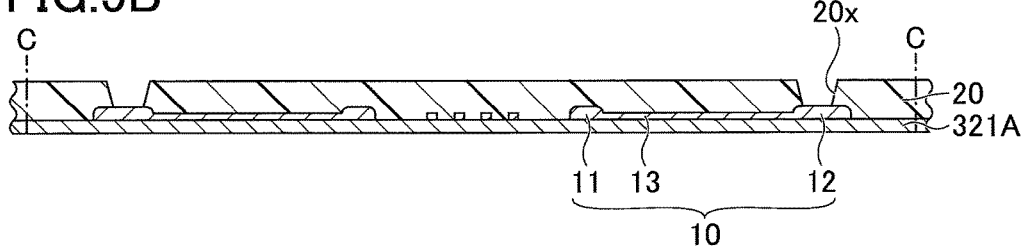
Figure 5C:
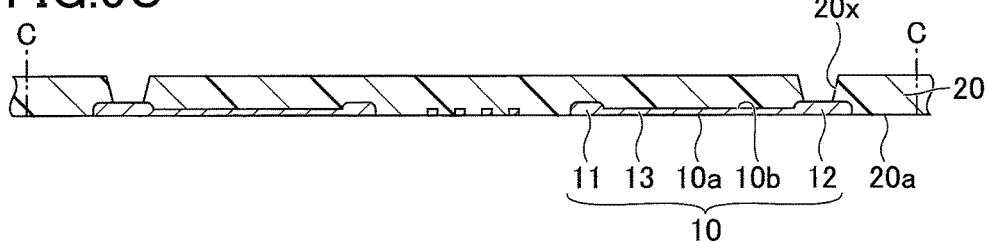

FIGS. 5A through 5C are diagrams depicting a process of manufacturing a wiring substrate according to the second variation. According to the second variation, a support 300A including the prepreg 310 and a carrier-supported metal foil 320A stacked on the prepreg 310 is used. The carrier-supported metal foil 320A includes the thick foil (carrier foil) 322 formed of copper and having a thickness of approximately 10 μm to approximately 50 μm, and thin foil 321A formed of nickel and having a thickness of approximately 1.5 μm to approximately 5 μm. The thin foil 321A separably adheres to the thick foil 322 through a delamination layer (not depicted). Because the thin foil 321A serves as an etch stop layer, the barrier layer 330 is not formed on the support 300A.

First, in the process depicted in FIG. 5A, the support 300A is made in the same manner as in the process depicted in FIG. 2A, and thereafter, the same process as in FIGS. 2C through 2G is executed to stack the wiring layer 10 and the insulating layer 20 directly on the support 300A. Next, in the process depicted in FIG. 5B, the prepreg 310 and the thick foil 322 of the support 300A are separated from the structure depicted in FIG. 5A in the same manner as in the process depicted in FIG. 2H. As a result, the thin foil 321A alone remains on the insulating layer 20, and the other members of the support 300A (the prepreg 310 and the thick foil 322) are removed.

Next, in the process depicted in FIG. 5C, etching is performed to remove the thin foil 321A formed of nickel (FIG. 5B). An etchant that does not remove copper but removes nickel may be selected to etch the thin foil 321A alone without etching the wiring layer 10. As a result, the first surface 10a of the wiring layer 10 is exposed at the first surface 20a of the insulating layer 20. The first surface 10a of the wiring layer 10 may be, for example, flush with the first surface 20a of the insulating layer 20.

After the process depicted in FIG. 5C, the structure depicted in FIG. 5C is cut at cutting positions C into individual pieces, using, for example, a slicer, to complete multiple wiring substrates 1 (FIGS. 1A and 1B).

For example, a metal layer may be formed on the first surface 10a of the wiring layer 10 and on the second surfaces of the pads 12 of the wiring layer 10 exposed in the openings 20x on an as-needed basis. Furthermore, external connection terminals such as solder balls may be provided on the pads 11 and/or the pads 12 exposed in the openings 20x on an as-needed basis. In addition, the solder resist layer 40 having the opening 40x may be formed on the chip mounting surface of the wiring substrate 1 on an as-needed basis.

Next, a third variation of the embodiment is described. According to the third variation, a support (carrier) is provided on the second surface 20b of the insulating layer 20. In the description of the third variation, a description of the same elements or configurations as those of the above-described embodiment may be omitted.

Figure 6:
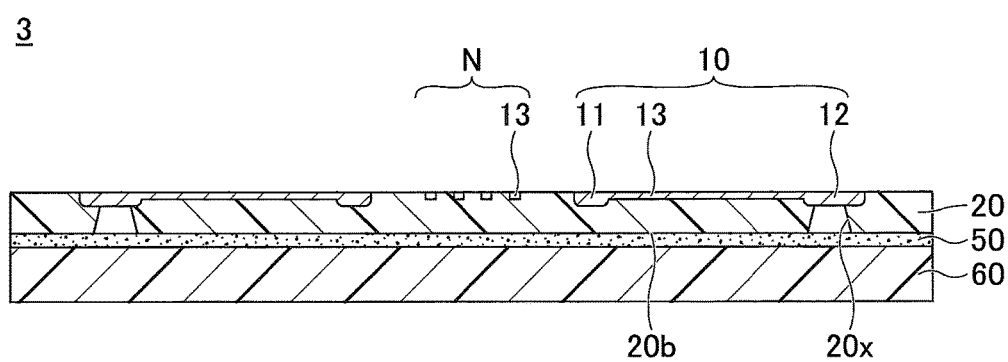
FIG. 6 is a cross-sectional view of a wiring substrate according to a third variation of the embodiment.

FIG. 6 is a cross-sectional view of a wiring substrate according to the third variation, depicting a cross section corresponding to the cross section depicted in FIG. 1B.

Referring to FIG. 6, a wiring substrate 3 is different from the wiring substrate 1 (FIGS. 1A and 1B) in that a support 60 is provided on the second surface 20b of the insulating layer 20 through an adhesive layer 50. The wiring substrate 3 may be manufactured by the following process, for example.

FIGS. 7A through 7D are diagrams depicting a process of manufacturing a wiring substrate according to the third variation.

Figure 7A:
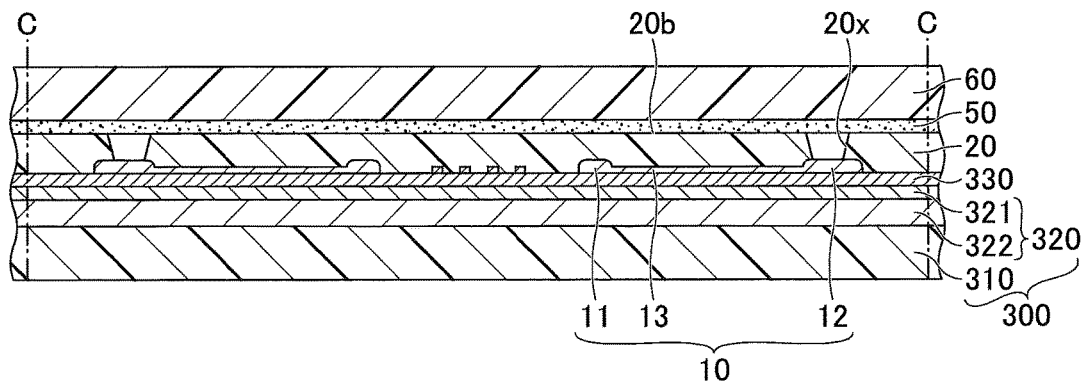
FIGS. 7A through 7D are diagrams depicting a process of manufacturing a wiring substrate according to the third variation.

First, in the process depicted in FIG. 7A, the same process as in FIGS. 2A through 2G is executed, and the support 60 is provided on the second surface 20b of the insulating layer 20 of the structure of FIG. 2G through the adhesive layer 50. For example, an acrylic, a silicone, or an epoxy resin may be used as the adhesive layer 50. For example, metal foil (such as copper foil), a resin film (such as a polyimide film), or a resin substrate (such as a glass epoxy substrate) may be used as the support 60.

As described below, a semiconductor chip may be mounted on the wiring substrate 3 that includes the adhesive layer 50 and the support 60. Therefore, the adhesive layer 50 and the support 60 have heat resistance to resist heat applied by, for example, reflow soldering during packaging.

Figure 7B:
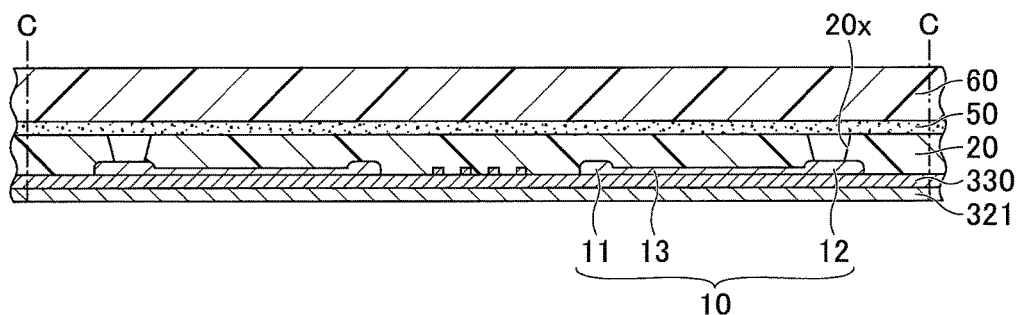

Next, in the process depicted in FIG. 7B, the prepreg 310 and the thick foil 322 of the support 300 are separated from the structure depicted in FIG. 7A in the same manner as in the process depicted in FIG. 2H. As a result, the thin foil 321 alone remains on the barrier layer 330, and the other members of the support 300 (the prepreg 310 and the thick foil 322) are removed.

Figure 7C:
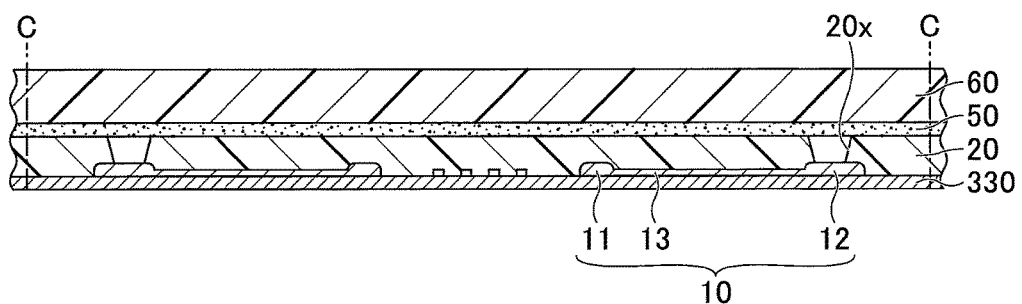

Next, in the process depicted in FIG. 7C, etching is performed to remove the thin foil 321 formed of copper (FIG. 7B) in the same manner as in the process depicted in FIG. 2I. Next, in the process depicted in FIG. 7D, the barrier layer 330 (FIG. 7C) is removed in the same manner as in the process depicted in FIG. 2J. As a result, the first surface 10a of the wiring layer 10 is exposed at the first surface 20a of the insulating layer 20. The first surface 10a of the wiring layer 10 may be, for example, flush with the first surface 20a of the insulating layer 20.

Figure 7D:
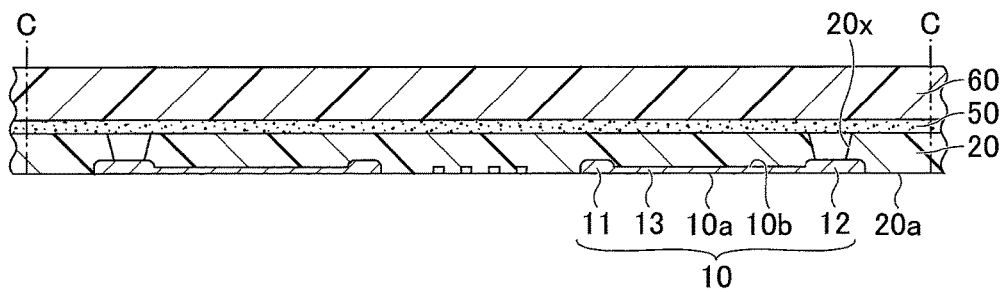

After the process depicted in FIG. 7D, the structure depicted in FIG. 7D is cut at cutting positions C into individual pieces, using, for example, a slicer, to complete multiple wiring substrates 3.

For example, a metal layer may be formed on the first surface 10a of the wiring layer 10 and on the second surfaces of the pads 12 of the wiring layer 10 exposed in the openings 20x before the process depicted in FIG. 7A on an as-needed basis. Furthermore, the solder resist layer 40 having the opening 40x may be formed on the chip mounting surface of the wiring substrate 3 after the process depicted in FIG. 7D on an as-needed basis. In addition, the support 300A depicted in FIG. 5A may be used in place of the support 300 used in the process depicted in FIG. 2A.

Moreover, before providing the support 60 on the structure of FIG. 2G to form the structure of FIG. 7A, a metal layer may be formed by, for example, electroless plating, or an anti-oxidation treatment such as an OSP process may be performed, on the second surfaces of the pads 12 exposed in the openings 20x of the structure of FIG. 2G on an as-needed basis. Furthermore, in the structure depicted in FIG. 7D, a metal layer may be formed by, for example, electroless plating, or an anti-oxidation treatment such as an OSP process may be performed, on the first surface 10a of the wiring layer 10.

Furthermore, the structure depicted in FIG. 7C, namely, a wiring substrate including the barrier layer 330 and the support 60, may be shipped as a product. The structure depicted in FIG. 7C or the structure depicted in FIG. 7D may be shipped as a product either before or after being cut into individual pieces.

The stiffness of the wiring substrate 3 as a whole is increased by the support 60 provided on the second surface 20b of the insulating layer 20. This facilitates, for example, the handling of the wiring substrate 3 when mounting a semiconductor chip on the wiring substrate 3 after the shipment of the wiring substrate 3 as described below with reference to FIGS. 9A through 9D.

The support 60 may be provided on the wiring substrate 2 depicted in FIG. 3. Furthermore, the process of FIGS. 7A through 7D may be executed using a structure in the middle of the process of manufacturing the wiring substrate 2.

Next, applications of a wiring substrate according to an embodiment of the present invention are described. According to a first application, a semiconductor chip is mounted (by flip-chip bonding) on the wiring substrate 1 of the above-described embodiment to form a semiconductor package. In the description of the first application, a description of the same elements or configurations as those of the above-described embodiment may be omitted.

Figure 8:
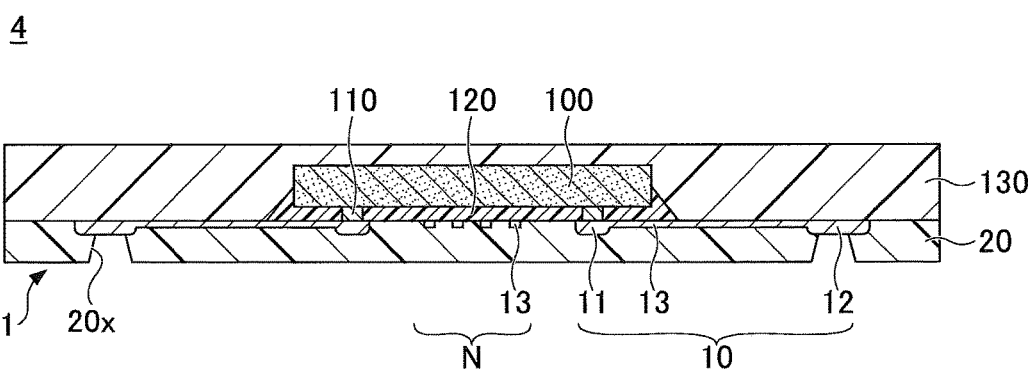
FIG. 8 is a cross-sectional view of a semiconductor package according to a first application.

FIG. 8 is a cross-sectional view of a semiconductor package according to a first application. Referring to FIG. 8, a semiconductor package 4 includes the wiring substrate 1 depicted in FIGS. 1A and 1B, a semiconductor chip 100, bumps 110, an underfill resin 120, and an encapsulation resin 130.

The semiconductor chip 100 includes, for example, a thin semiconductor substrate formed of, for example, silicon (not depicted) and a semiconductor integrated circuit (not depicted) formed on the semiconductor substrate. Electrode pads (not depicted) are formed on the semiconductor substrate to be electrically connected to the semiconductor integrated circuit.

The bumps 110 electrically connect the electrode pads of the semiconductor chip 100 and the pads 11 of the wiring substrate 1. The bumps 110 are, for example, solder bumps. Suitable materials for solder bumps include, for example, alloys containing lead (Pb), tin-copper (Sn—Cu) alloys, tin-silver (Sn—Ag) alloys, and tin-silver-copper (Sn—Ag—Cu) alloys.

The underfill resin 120 fills in the space between the semiconductor chip 100 and the wiring substrate 1 (the insulating layer 20). For example, an insulating resin such as a thermosetting epoxy resin that contains no filler may be used as the underfill resin 120.

The encapsulation resin 130 is formed on the wiring substrate 1 to cover the semiconductor chip 100 and the underfill resin 120. The upper surface (rear surface) of the semiconductor chip 100 may be exposed at the upper surface of the encapsulation resin 130. For example, an insulating resin such as a thermosetting epoxy resin that contains a filler (a so-called mold resin) may be used as the encapsulation resin 130.

The underfill resin 120 is optional and may be provided on an as-needed basis. Furthermore, it is also possible to provide the underfill resin 120 alone without providing the encapsulation resin 130.

To manufacture the semiconductor package 4, for example, the semiconductor chip 100 is mounted face down on the chip mounting surface of the wiring substrate 1 through the bumps 110 in paste form. Then, for example, reflow soldering is performed to melt and thereafter solidify the bumps 110 to electrically connect the electrode pads of the semiconductor chip 100 and the pads 11 of the wiring substrate 1.

Subsequently, the space between the semiconductor chip 100 and the wiring substrate 1 (the insulating layer 20) is filled with the underfill resin 120 on an as-needed basis, and thereafter, the encapsulation resin 130 is formed on the wiring substrate 1 to cover the semiconductor chip 100 and the underfill resin 120. The encapsulation resin 130 may be formed by, for example, transfer molding, using an encapsulation mold. External connection terminals such as solder balls may be provided on the pads 12 exposed in the openings 20x on an as-needed basis.

Figure 9A:
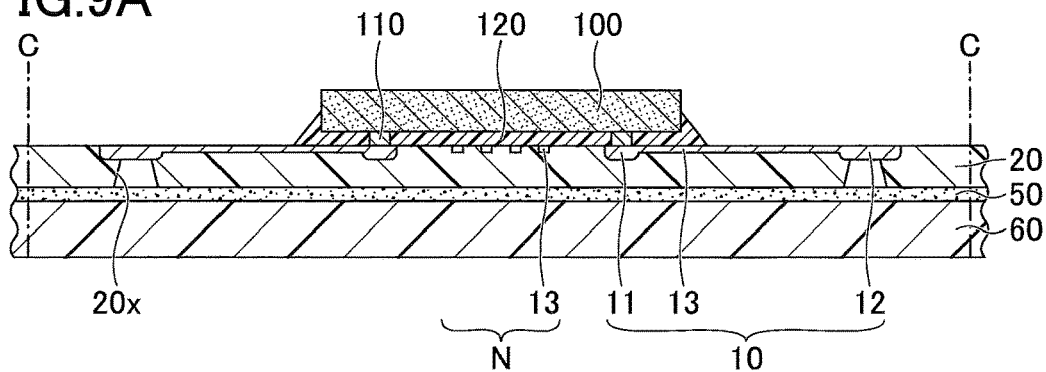
FIGS. 9A through 9D are diagrams depicting a process of manufacturing a semiconductor package according to the first application.

According to the semiconductor package 4, the wiring substrate 2 or 3 may be used in place of the wiring substrate 1. In the case of using the wiring substrate 3, as depicted in FIG. 9A, the semiconductor chip 100 is mounted face down on the chip mounting surface of each region to become the wiring substrate 3 through the bumps 110 in paste form without dividing the structure obtained after the process of FIG. 7D into individual pieces. Then, for example, reflow soldering is performed to melt and thereafter solidify the bumps 110 to electrically connect the electrode pads of the semiconductor chip 100 and the pads 11 of each region to become the wiring substrate 3. Then, the space between the semiconductor chip 100 and the insulating layer 20 is filled with the underfill resin 120 on an as-needed basis. In FIGS. 7A through 7D and 9A through 9D, the wiring substrate is depicted in an inverted position.

Figure 9B:
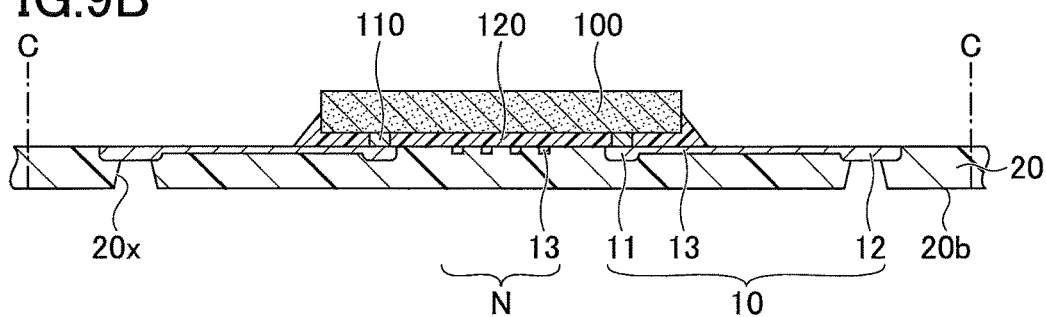

Next, as depicted in FIG. 9B, a mechanical force is applied to the support 60 depicted in FIG. 9A to separate the adhesive layer 50 and the support 60 from the lower surface 20b of the insulating layer 20.

Figure 9C:
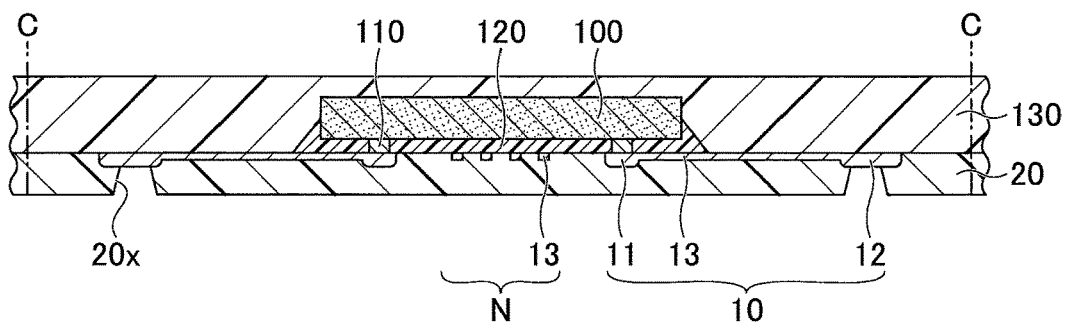
Figure 9D:
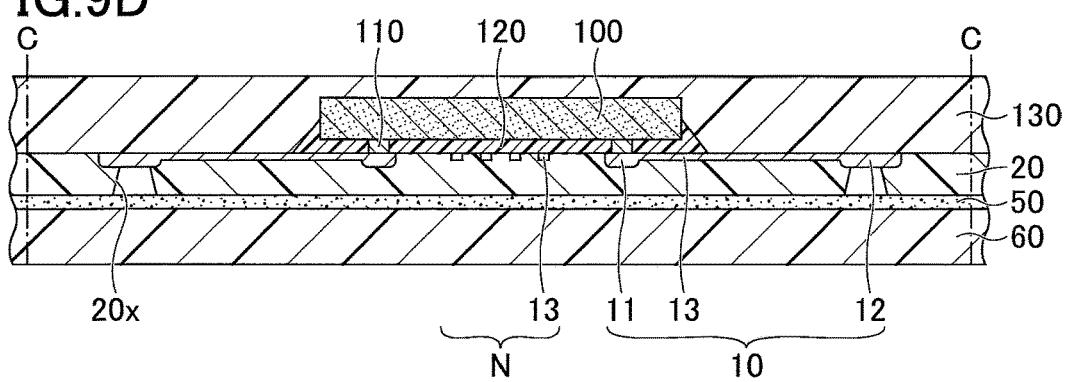

Next, as depicted in FIG. 9C, the encapsulation resin 130 is formed on each region to become the wiring substrate 3 to cover the semiconductor chip 100 and the underfill resin 120 by, for example, transfer molding.

After the process depicted in FIG. 9C, the structure depicted in FIG. 9C is cut at cutting positions C into individual pieces, using, for example, a slicer, to complete multiple semiconductor packages 4 (FIG. 8). External connection terminals such as solder balls may be provided on the pads 12 exposed in the openings 20x on an as-needed basis.

Alternatively, the encapsulation resin 130 may be formed with the support 60 being provided, and thereafter, the support 60 may be removed and the resultant structure may be divided into individual pieces to form multiple semiconductor packages 4. That is, the encapsulation resin 130 may be formed on the structure of FIG. 9A to form the structure of FIG. 9D, the support 60 may thereafter be removed from the structure of FIG. 9D to form the structure of FIG. 9C, and the structure of FIG. 9C may thereafter be divided into individual pieces to form multiple semiconductor packages 4. In this case, because the support 60 is removed after the encapsulation resin 130 is formed, it is possible to prevent the deformation of a wiring substrate even when the stiffness of the wiring substrate is low.

Thus, it is possible to realize the semiconductor package 4 by mounting the semiconductor chip 100 on the wiring substrate 1, 2 or 3.

The pads 11 may include different kinds of pads having different widths. In this case, pads different in width are also different in thickness (wider pads are thicker), while the surfaces of the pads 11 to face the semiconductor chip 100 when the semiconductor chip 100 is mounted are in the same plane. Therefore, even when the pads 11 are different in thickness, the gap is uniform between the pads 11 and the corresponding electrode pads of the semiconductor chip 100. Accordingly, the pads 11 and the corresponding electrode pads of the semiconductor chip 100 can be easily connected.

Next, a second application of a wiring substrate is described. According to the second application, a semiconductor package is mounted on another semiconductor package to form a semiconductor package having a so-called package-on-package (POP) structure. In the description of the second application, a description of the same elements or configurations as those of the above-described embodiment may be omitted.

Figure 10:
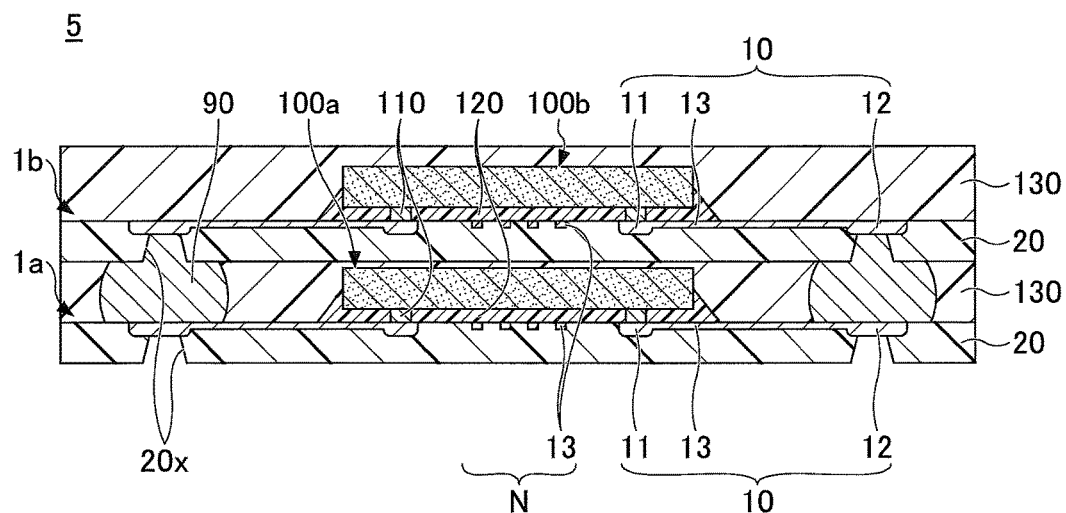
FIG. 10 is a cross-sectional view of a semiconductor package according to a second application.

FIG. 10 is a cross-sectional view of a semiconductor package according to the second application. Referring to FIG. 10, a semiconductor package 5 is a semiconductor package having a so-called POP structure, in which a wiring substrate 1b on which a semiconductor chip 100b is mounted is further mounted through bumps 90 on a wiring substrate 1a on which a semiconductor chip 100a is mounted. The wiring substrates 1a and 1b are examples of the wiring substrate 1, and the semiconductor chips 100a and 100b are examples of the semiconductor chip 100. For example, solder balls having a structure of a copper core ball enclosed by solder may be used as the bumps 90. According to the semiconductor package 5, the wiring substrates 2 or 3 may be used in place of the wiring substrates 1a and 1b.

To manufacture the semiconductor package 5, for example, two structures identical to the structure depicted in FIG. 9B are manufactured. Then, solder balls having a structure of a copper core ball enclosed by solder are mounted on one of the structures ("lower structure"), and the other of the structures ("upper structure") is further mounted on the lower structure on which the solder balls are mounted. At this point, the upper and lower structures are disposed so that the upper surfaces of the pads 12 of the lower structure and the lower surfaces of the pads 12 inside the openings 20x of the upper structure face each other across the solder balls.

Next, reflow soldering is performed while pressing the upper structure against the lower structure, so as to melt and thereafter solidify the solder around copper core balls to join the upper and lower pads 12 through the copper core balls. At this point, the solder solidifies with the copper core balls contacting the upper and lower pads 12. Therefore, the copper core balls serve as a spacer member to keep a predetermined distance between the upper and lower structures.

Thereafter, the encapsulation resin 130 is formed by, for example, transfer molding to cover the semiconductor chip 100 and the underfill resin 120 of each of the upper and lower structures. Thereafter, the resultant structure is divided into individual pieces, using, for example, a slicer, to complete multiple semiconductor packages 5 (FIG. 10). External connection terminals such as solder balls may be provided on the pads 12 exposed in the openings 20x of the lower structure on an as-needed basis.

Thus, it is possible to realize the semiconductor package 5 having a POP structure, using the wiring substrate 1, 2 or 3 according to the above-described embodiment.

Example 1

With respect to a portion of a small wiring width (hereinafter referred to as "fine line portion") and a portion of a large wiring width (hereinafter referred to as "rough line portion"), the plating thickness of a wiring line formed by copper electroplating was studied under different copper electroplating conditions.

Here, the line/space was 10 μm/10 μm in the fine line portion and was 25 μm/25 μm in the rough line portion.

First, a resist layer having openings for forming the fine line portion of a line/space of 10 μm/10 μm and the rough line portion of a line/space of 25 μm/25 μm was formed on a substrate on which a conductive layer was provided.

Next, a bath of an electrolytic copper plating solution of copper sulfate and sulfuric acid of a concentration ratio of 1 and a bath of an electrolytic copper plating solution of copper sulfate and sulfuric acid of a concentration ratio of 5 were prepared. Then, electroplating was performed for a plating time of 60 minutes at a current density of 1.0 ASD (A/dm$^2$), using each electrolytic copper plating solution, to deposit an electrolytic copper plating film in the openings of the resist layer corresponding to the fine line portion and the rough line portion.

Furthermore, as Comparative Example 1, a bath of an electrolytic copper plating solution of copper sulfate and sulfuric acid of a concentration ratio of 0.2 and a bath of an electrolytic copper plating solution of copper sulfate and sulfuric acid of a concentration ratio of 5.5 were prepared. Then, in the same manner as in Example 1, electroplating was performed for a plating time of 60 minutes at a current density of 1.0 ASD, using each electrolytic copper plating solution, to deposit an electrolytic copper plating film in the openings of the resist layer corresponding to the fine line portion and the rough line portion.

The results are presented in FIG. 11. As is understood from FIG. 11, when the concentration ratio of copper sulfate and sulfuric acid was 1, the plating thickness of the fine line portion was approximately 13 μm on average and the plating thickness of the rough line portion was approximately 15 μm on average. Thus, the difference in plating thickness between the fine line portion and the rough line portion was approximately 2 μm. Furthermore, when the concentration ratio of copper sulfate and sulfuric acid was 5, the plating thickness of the fine line portion was approximately 12 μm on average and the plating thickness of the rough line portion was approximately 15.5 μm on average. Thus, the difference in plating thickness between the fine line portion and the rough line portion was approximately 3.5 μm. That is, with either concentration ratio, there was a sufficient plating thickness difference of 1 μm or more on average between the fine line portion and the rough line portion.

In contrast, when the concentration ratio of copper sulfate and sulfuric acid was 0.2 in Comparative Example 1, the plating thickness of the fine line portion was approximately 14 μm on average and the plating thickness of the rough line portion was approximately 14.5 μm on average. Thus, the difference in plating thickness between the fine line portion and the rough line portion was approximately 0.5 μm. Furthermore, when the concentration ratio of copper sulfate and sulfuric acid was 0.2 in Comparative Example 1, there was abnormal deposition of electrolytic copper plating due to an insufficient supply of copper ions. When the concentration ratio of copper sulfate and sulfuric acid was 5.5 in Comparative Example 1, there was abnormal deposition of electrolytic copper plating due to an excessive supply of copper ions to make it impossible to measure plating thickness and thus to present a result in FIG. 11.

Thus, when the concentration ratio of copper sulfate and sulfuric acid is 0.2 or less or 5.5 or more, the quality of an electrolytic copper plating film cannot be ensured. Therefore, the concentration ratio of copper sulfate and sulfuric acid is preferably more than or equal to 0.2 and less than or equal to 5. The concentration ratio of copper sulfate and sulfuric acid in the range of 1 through 5, which makes it possible to obtain a conspicuous plating thickness difference of 1 μm or more on average between the fine line portion and the rough line portion, is particularly preferable.

Example 2

Samples were manufactured with the aspect ratio of a resist layer ranging from 1 to 4 in increments of 0.5. Then, using a bath of an electrolytic copper plating solution prepared from copper sulfate and sulfuric acid of a concentration ratio of 5, electroplating was performed for a plating time of 60 minutes at a current density of 1.0 ASD, using resist layers of different aspect ratios. Thereafter, the resist layers were removed, and a percent defective in the removal of resist layers was measured with respect to each aspect ratio.

Furthermore, as Comparative Example 2, using a bath of an electrolytic copper plating solution prepared from copper sulfate and sulfuric acid of a concentration ratio of 0.2 or less, electroplating was performed for a plating time of 60 minutes at a current density of 1.0 ASD, using resist layers of different aspect ratios. Thereafter, the resist layers were removed, and a percent defective in the removal of resist layers was measured with respect to each aspect ratio.

Figure 12:
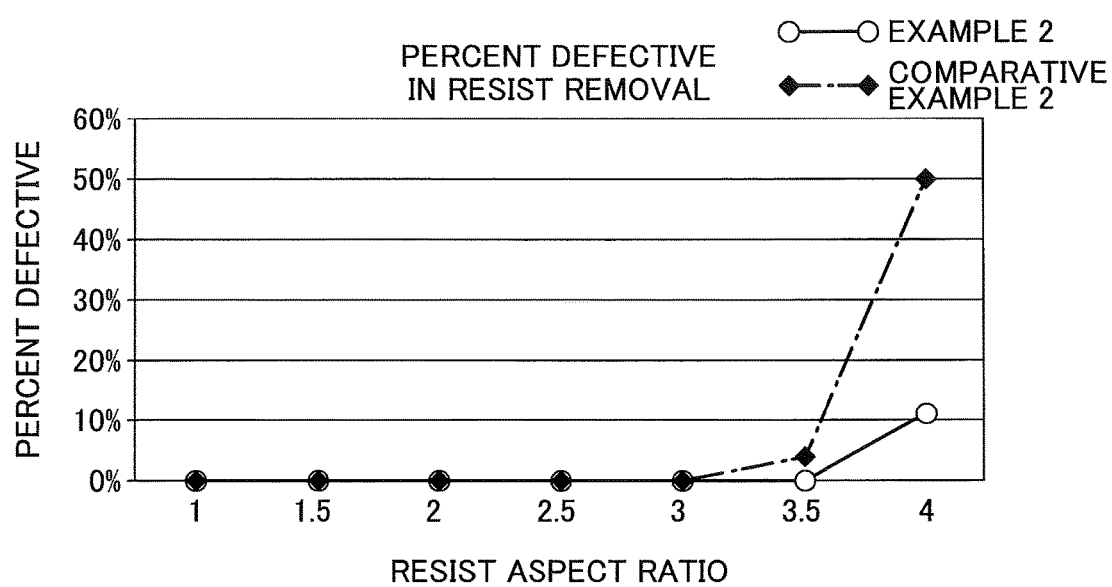
FIG. 12 is a graph illustrating the results of Example 2.

The results are presented in FIG. 12. As is understood from FIG. 12, according to Example 2, the percent defective was 0% when the aspect ratio of the resist layer was 3.5 or less, and was approximately 10% when the aspect ratio of the resist layer was 4. In contrast, according to Comparative Example 2, the percent defective was 5% when the aspect ratio of the resist layer was 3.5, and was approximately 50% when the aspect ratio of the resist layer was 4.

Thus, it has been confirmed that it is possible to significantly reduce a percent defective in resist removal by reducing plating thickness in a portion of a high aspect ratio (namely, a fine line portion) of a resist layer.

All examples and conditional language provided herein are intended for pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority or inferiority of the invention. Although one or more embodiments of the present invention have been described in detail, it should be understood that the various changes, substitutions, and alterations could be made hereto without departing from the spirit and scope of the invention.

For example, in the above-described embodiment, a wiring pattern and a pad are taken as an example of a narrow portion and an example of a wide portion, respectively, of a wiring layer. A narrow portion and a wide portion of a wiring layer, however, are not limited to these. For example, the wide portion may be a plane layer of a power supply or ground. Furthermore, wiring patterns may include narrow wiring patterns and wide wiring patterns.

Furthermore, in the process of manufacturing a wiring substrate, the carrier-supported metal foil 320 or 320A may be stacked on each side of the prepreg 310 to form a support, and a wiring substrate may be formed on each side of the support.

Various aspects of the subject-matter described herein may be set out non-exhaustively in the following numbered clauses:

1. A method of manufacturing a wiring substrate, including:

forming a wiring layer on a support by depositing plating on the support, the wiring layer including a first portion and a second portion, the first portion being narrower and thinner than the second portion, a first surface of the first portion and a first surface of the second portion contacting the support;

forming an insulating layer on the support to cover the first portion and the second portion with the insulating layer, the insulating layer including a first surface contacting the support;

forming an opening in the insulating layer, the opening being open at a second surface of the insulating layer opposite to the first surface thereof and exposing a part of a second surface of the second portion opposite to the first surface thereof; and removing the support.

2. The method of clause 1, further including:

between forming the opening and removing the support, providing another support on the second surface of the insulating layer through an adhesive layer.

3. The method of clause 1, wherein, in forming the wiring layer, the first portion and the second portion are formed of copper plating by electroplating, using a bath of an electrolytic copper plating solution prepared from copper sulfate and sulfuric acid of a predetermined concentration ratio, and the first portion is formed to be thinner than the second portion by adjusting the predetermined concentration ratio in advance.

What is claimed is:

1. A wiring substrate comprising:
an insulating layer; and
a wiring layer buried in the insulating layer at a first surface of the insulating layer,
the wiring layer including a first portion and a second portion, the first portion being narrower and thinner than the second portion, the first portion including a first surface exposed at the first surface of the insulating layer, the second portion including a first surface exposed at the first surface of the insulating layer and a second surface partly exposed in an opening formed in the insulating layer, the opening being open at a second surface of the insulating layer opposite to the first surface thereof,
wherein the wiring layer includes a first surface exposed at the first surface of the insulating layer, a second surface opposite to the first surface of the wiring layer, and a side surface, and
wherein a surface roughness of the second surface of the wiring layer and the side surface of the wiring layer is greater than a surface roughness of the first surface of the wiring layer.

2. The wiring substrate as claimed in claim 1, wherein the first surface of the first portion and the first surface of the second portion are in a same plane.

3. The wiring substrate as claimed in claim 1, wherein
the first portion further includes a second surface opposite to the first surface thereof and a side surface, the second surface of the first portion and the side surface of the first portion being covered with the insulating layer, and
the second portion further includes a side surface, the second surface of the second portion and the side surface of the second portion being covered with the insulating layer.

4. The wiring substrate as claimed in claim 1, wherein
the first portion includes a wiring pattern, and
the second portion includes a pad.

5. The wiring substrate as claimed in claim 4, wherein the pad includes a first pad to connect to a semiconductor chip, exposed at the first surface of the insulating layer, and a second pad for external connection, exposed in the opening.

6. The wiring substrate as claimed in claim 1, wherein the first surface of the first portion and the first surface of the second portion are depressed relative to the first surface of the insulating layer.

7. The wiring substrate as claimed in claim 1, further comprising:
a support provided on the second surface of the insulating layer through an adhesive layer.

8. The wiring substrate as claimed in claim 1, wherein
a recess is formed in the second surface of the second portion exposed in the opening.

9. A semiconductor package, comprising:
a wiring substrate,
the wiring substrate including
an insulating layer; and
a wiring layer buried in the insulating layer at a first surface of the insulating layer; and
a semiconductor chip mounted over the first surface of the insulating layer,
wherein the wiring layer includes a first portion and a second portion, the first portion being narrower and thinner than the second portion, the first portion including a first surface exposed at the first surface of the insulating layer, the second portion including a first surface exposed at the first surface of the insulating layer and a second surface partly exposed in an opening formed in the insulating layer, the opening being open at a second surface of the insulating layer opposite to the first surface thereof,
wherein the first portion includes a wiring pattern, and the second portion includes a first pad connected to the semiconductor chip, exposed at the first surface of the insulating layer, and a second pad for external connection, exposed in the opening,
wherein the wiring layer includes a first surface exposed at the first surface of the insulating layer, a second surface opposite to the first surface of the wiring layer, and a side surface, and
wherein a surface roughness of the second surface of the wiring layer and the side surface of the wiring layer is greater than a surface roughness of the first surface of the wiring layer.

10. The semiconductor package as claimed in claim 9, wherein the first surface of the first portion and the first surface of the second portion are in a same plane.

11. The semiconductor package as claimed in claim 9, wherein
the first portion further includes a second surface opposite to the first surface thereof and a side surface, the second surface of the first portion and the side surface of the first portion being covered with the insulating layer, and
the second portion further includes a side surface, the second surface of the second portion and the side surface of the second portion being covered with the insulating layer.

12. The semiconductor package as claimed in claim 9, wherein the first surface of the first portion and the first surface of the second portion are depressed relative to the first surface of the insulating layer.

13. The semiconductor package as claimed in claim 9, wherein
a recess is formed in the second surface of the second portion exposed in the opening.

* * * * *